United States Patent [19]

Juergens

[11] Patent Number: 4,774,193

[45] Date of Patent: Sep. 27, 1988

[54] METHOD FOR AVOIDING SHORTS IN THE MANUFACTURE OF LAYERED ELECTRICAL COMPONENTS

[75] Inventor: Wilfried Juergens, Munich, Fed. Rep. of Germany

[73] Assignee: Siemens Aktiengesellschaft, Berlin and Munich

[21] Appl. No.: 21,812

[22] Filed: Mar. 4, 1987

[30] Foreign Application Priority Data

Mar. 11, 1986 [DE] Fed. Rep. of Germany ....... 3608074

[51] Int. Cl.⁴ ............................................. H01L 31/18
[52] U.S. Cl. ......................................... 437/4; 437/229; 437/923; 437/939; 437/2; 136/258; 136/290; 430/313
[58] Field of Search .................. 437/2, 4, 67, 180, 183, 437/229, 923, 939; 136/258 PC, 258 AM, 290; 430/311, 313, 315; 29/575

[56] References Cited

U.S. PATENT DOCUMENTS

4,725,558  2/1988  Yamazaki et al. ......................... 437/2

FOREIGN PATENT DOCUMENTS

0060487  9/1982  European Pat. Off. ............. 136/290
55-74544  6/1980  Japan ................................... 29/575
58-77263  5/1983  Japan ............................. 136/258 AM

OTHER PUBLICATIONS

"Amorphous and Polycrystalline Semiconductors", Hewang, vol. 18 in the series Semiconductor Electronics (1984), pp. 58–64.

Primary Examiner—Aaron Weisstuch
Attorney, Agent, or Firm—Hill, Van Santen, Steadman & Simpson

[57] ABSTRACT

A method for avoiding shorts between two separated layer electrodes in a layered electrical component, such as a solar cell having amorphous silicon layers, includes the steps of generating a first electrode layer on a substrate, generating an intermediate non-electrode layer, which may possibly have voids therein, over the first electrode, and generating a photo-resist layer on the intermediate layer which fills any voids which may exist in the intermediate layer. The substrate and the first electrode layer are transmissive for selected radiation, and the intermediate layer is non-transmissive for the selected radiation. The photo-resist is exposed in the voids by irradiation with the selected radiation through the substrate and the first electrode layer, so that the exposed photo-resist in the voids has a different solubility than the unexposed remainder of the photo-resist. If the photo-resist is of the type such that irradiation polymerizes the exposed photo-resist, a polymerized plug will be present in any voids which may exist in the intermediate layer, so that when a second electrode layer is subsequently applied over the intermediate layer, no shorts will result through the voids. If the photo-resist is of the opposite type, the soluble photo-resist is removed from the voids, leaving a mask of polymerized photo-resist over the intermediate layer, and the voids are filled using the mask with an insulating material. The photo-resist mask is then removed and the second electrode layer is generated over the intermediate layer, with the insulating plugs again preventing the formation of shorts through the voids.

11 Claims, 2 Drawing Sheets

METHOD FOR AVOIDING SHORTS IN THE MANUFACTURE OF LAYERED ELECTRICAL COMPONENTS

BACKGROUND OF THE INVENTION

1. Field of the Invention

The present invention is directed to a method for avoiding shorts in the manufacture of layered electrical components including two electrodes disposed over each other separated by an insulating or a semiconducting layer, and particularly to a method for manufacturing thin-film solar cells consisting of amorphous silicon layers.

2. Description of the Prior Art

Thin-film solar cells are known in the art which are produced by deposition on a substrate of the layer sequence of a transparent base electrode, an active amorphous silicon layer, and a cover electrode. The structure and operation of such thin-film solar cells of amorphous silicon are described, for example, in the book by Heywang entitled "Amorphe und polykristalline Halbleiter," in the series "Halbleiter-Elektronik", Volume 18, (1984), pages 58–64.

Considerable currents can arise in large area solar cells, for example, greater than 1.5 amperes given an efficiency of 10 percent, a standard illumination of AM1 (100 mW/cm$^2$) and 10×10 cm$^2$ area. Under such circumstances, losses which can no longer be ignored arise due to series resistance or transfer resistances. In thin-film solar cells, shorts having a considerable influence on the efficiency of the cells can arise between the electrodes if the active semiconductor layer does not densely cover the base electrode, that is, if voids are present in the amorphous silicon.

In order to reduce the series resistance of solar cells, so-called finger electrode structures (grids) are applied to the cells. Such a solar cell having, for example, a layer sequence of a substrate, a base electrode of molybdenum, an amorphous silicon (n-i-p) layer structure, a semi-transparent cover electrode of indium-doped tin oxide, and a grid electrode is disclosed in U.S. Pat. No. 4,417,092. Shorts between the base electrode and the highly conductive cover electrode are particularly critical in the region of the grid electrode structure, and may make the cells unusable.

In order to avoid these difficulties, attempts have previously been made to burn away the shorts by applying a voltage to the cover electrode and to the base electrode or, after detection of a void in the silicon with a sensor, to burn off the cover and/or base electrode at that location with a laser. The former method has the disadvantage that the void may not be so highly resistant that an adequately high current cannot flow and the cover electrode cannot be too thick. The latter method is complicated and extremely expensive.

SUMMARY OF THE INVENTION

It is an object of the present invention to reliably suppress shorts caused by voids in a layer separating two layer electrodes of an electronic component. A further object of the present invention is to reliably suppress shorts in solar cells having an amorphous silicon layer separating two active electrodes.

Another object of the present invention is to provide a method for reliably suppressing shorts in a layered electronic component which is uncomplicated and relatively inexpensive to perform.

The above objects are achieved in accordance with the principles of the present invention in a method for manufacturing a layered electrical component which includes the steps of generating a first electrode layer on a substrate, generating an intermediate non-electrode layer, possibly having voids therein, over the first electrode, and generating a photo-resist layer on the intermediate layer, with the photo-resist layer filling any voids which may exist in the intermediate layer. The substrate and the first electrode layer are transmissive for selected radiation, and the intermediate layer is non-transmissive for the selected radiation. The photo-resist is irradiated by the selected radiation through the substrate and the first layer so that the exposed photo-resist in the voids has a different solubility from the unexposed remainder of the photo-resist. The different solubilities are used to generate an insulating plug in each of the voids upon removal of a portion of the photo-resist. A cover electrode is then generated over the intermediate layer after the photo-resist has been removed, so that the plug-filled voids are also covered. The material comprising the cover electrode is thus prevented from flowing through the voids by the plugs and shorts between the two electrode layers are thus avoided.

If the photo-resist is of the type such that polymerization occurs upon exposure to the selected radiation, the polymerized photo-resist is permitted to remain in the voids as the insulating plug, and the remaining photo-resist on the surface of the intermediate layer is removed by washing with a suitable removal solution. If the photo-resist is of the opposite type, i.e., the exposed photo-resist has a greater solubility than the unexposed photo-resist, the photo-resist having a greater solubility (i.e., the photo-resist in the voids) is washed away, leaving empty voids and a mask of photo-resist material covering the intermediate layer. Insulating material is then applied to the surface of the intermediate layer covered by the photo-resist layer, which permits the insulating material only to flow into the voids. The photo-resist layer is then removed, leaving the voids filled with insulating material. A cover electrode is then generated on the surface of the intermediate layer, and is prevented from flowing into the voids by the insulating plugs, thereby preventing contact with the first electrode layer.

DESCRIPTION OF THE PREFERRED EMBODIMENTS

Figure 1:
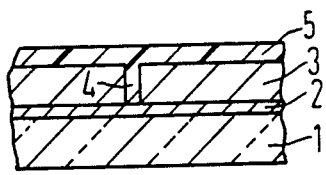
FIGS. 1 and 2 are side sectional views of a layered electrical component constructed in accordance with the method herein showing steps common to methods using both types of photo-resist.
Figure 2:
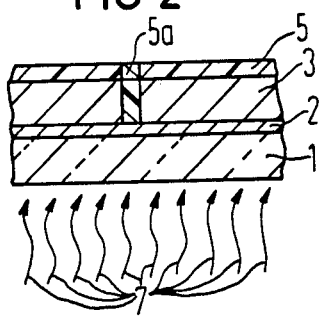

A side sectional view of a portion of a layered electronic component constructed in accordance with the principles of the present invention is shown in the initial steps of manufacture in FIGS. 1 and 2. The component includes a base electrode layer 2 consisting of, for example, fluorine-doped tin oxide. The base electrode layer 2 is vapor-deposited surface-wide on a transparent substrate 1 consisting of, for example, glass. An active semiconductor layer structure 3 is applied over the base electrode layer 2. The internal structural details of the layer structure 3 are not shown in the drawings, however, the layer structure 3 may consist of an n-i-p or a p-i-n sequence of amorphous silicon layers. In the generation of the layer structure 3, it is possible that a void or hole will be formed at a location indicated at 4. The void may potentially cause a short between the base electrode 2 and a cover electrode to be applied subsequently over the layer structure 3, because the material comprising the cover electrode could flow through the void and come into contact with the base electrode 2.

To avoid such shorts, the layer structure 3, which may be considered an intermediate layer, is covered with a photo-resist layer 5, which will flow into the voids as indicated at 5a. The substrate 1 and the base electrode 2 are transmissive for selected radiation, while the layer structure 3 is opaque to the selected radiation. The structure is then irradiated from below by such selected radiation indicated at 7, so that the photo-resist 5a in the void is exposed, while the remainder of the photo-resist layer 5 is unexposed.

The photo-resist consists of insulating material, and may, for example, be a Novolak/epoxy/photopolymer.

Figure 3:
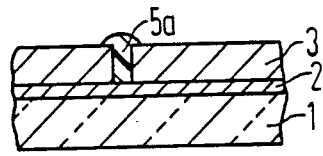
FIGS. 3 and 4 are side sectional views of a layered electronic component constructed in accordance with the method disclosed herein showing method steps using a first type of photo-resist in a first embodiment of the method.

If the photo-resist is of the type such that exposure to the radiation 7 causes polymerization of the photo-resist, the photo-resist 5a in the void will harden into a plug. As shown in FIG. 3, the remainder of the photo-resist layer 5 is then removed by washing with a suitable solution, such as butyl diglycol, which does not attack amorphous silicon.

The transparent conductive base electrode layer 2 may consist, for example, of so-called TCO (transparent conducting oxide). The amorphous silicon layer structure 3 may be, for example, 0.5 $\mu$m thick, which is opaque for ultraviolet light in regions which are free of voids, so that the selected radiation 7 may be ultraviolet radiation, preferably in the wavelength range of about 350 through about 400 nm.

Figure 4:
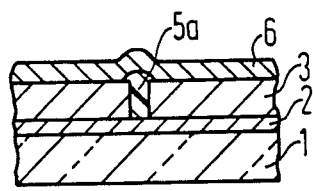

As shown in FIG. 4, a cover electrode layer 6 consisting of, for example, silver, palladium, or nickel-chrome is applied over the layer structure 3 with the plugs 5a. The material comprising the electrode layer 6 would otherwise flow through the voids 5 and cause a short circuit with the base electrode 2. As shown in FIG. 4, however, the electrode layer 6 is prevented from flowing into the voids by the insulating plug 5a, so that shorts can not occur at those locations. This is especially important, for example, at critical locations in certain electronic components, such as beneath a grid electrode structure in solar cells.

Figure 5:
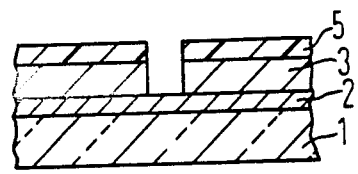
FIGS. 5 through 8 are side sectional views of a layered electronic component constructed in accordance with the method disclosed herein showing method steps using a second type of photo-resist in a second embodiment of the method.
Figure 6:
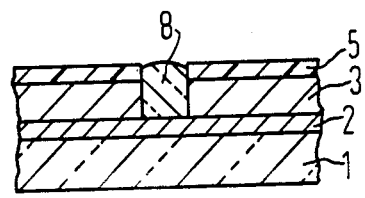
Figure 7:
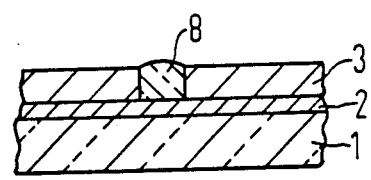
Figure 8:
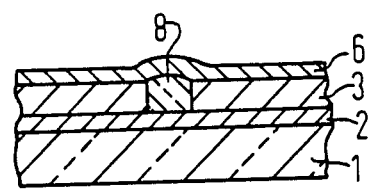

A second embodiment of the method wherein an opposite type of photo-resist is used is shown in FIGS. 5 through 8, which follow in method steps after the structure shown in FIG. 2. In this embodiment, a type of photo-resist is employed having the characteristic of exposed photo-resist having greater solubility than unexposed photo-resist. Thus, after irradiation with selected radiation 7 from below as shown in FIG. 2, the plug 5a, being more soluble, is washed away while the remainder if the layer 5 remains, leaving an open void as shown in FIG. 5. The remaining resist layer 5 is then used as a mask and suitable insulating material 8 is applied which, as a result of the resist mask 5, fills only the empty voids. The resist layer 5 is then removed, leaving the structure as shown in FIG. 7 with the void filled by an insulating plug 8. The cover electrode layer 6 is then applied as discussed in connection with FIG. 4, and again short circuits with the base electrode layer 2 are prevented by the insulating plugs 8 filling the voids.

Although modifications and changes may be suggested by those skilled in the art it is the intention of the inventor to embody within the patent warranted hereon all changes and modifications as reasonably and properly come within the scope of his contribution to the art.

I claim as my invention:

1. A method for avoiding shorts between two normally separated layer electrodes in a layered electrical component constructed on a substrate, said substrate being transmissive for selected radiation, said method comprising the steps of:

generating a first electode layer on said substrate, said first electrode layer being transmissive for said selective radiation;

generating an intermediate non-electrode layer, which may have voids therein, over said first electrode layer, said intermediate layer being non-transmissive for said selected radiation;

generating a photo-resist layer on said intermediate layer, said photo-resist layer filling any voids which may exist in said intermediate layer;

exposing said photo-resist in said voids by irradiation with said selected radiation through said substrate and said first electrode layer such that the exposed photo-resist in said voids has a greater solubility than the unexposed remainder of said photo-resist layer;

removing said photo-resist having a greater solubility in said voids, leaving said voids empty and leaving a remainder of said photo-resist layer covering said intermediate layer;

filling said empty voids with insulating material using said remaining photo-resist layer as a mask;

removing said remaining photo-resist layer leaving said intermediate layer uncovered and leaving said voids filled with said insulating material as plugs; and covering said intermediate layer including the plug-filled voids with a second electrode layer, whereby the material of said second electrode layer is prevented by said plugs from flowing through said voids to cause short circuits with said first electrode layer.

2. A method as claimed in claim 1, wherein said photo-resist layer is an insulating layer.

3. A method as claimed in claim 1, wherein said intermediate layer is an internally structured layer of amorphous silicon.

4. A method as claimed in claim 3, wherein said amorphous silicon is applied in a p-i-n layer structure.

5. A method as claimed in claim 3, wherein said amorphous silicon is applied in a n-i-p layer structure.

6. A method as claimed in claim 1, wherein said selected radiation is ultraviolet radiation.

7. A method as claimed in claim 1, wherein said ultraviolet radiation has a wavelength in the range from about 350 through about 400 nm.

8. A method as claimed in claim 1, wherein said substrate is glass.

9. A method as claimed in claim 1, wherein said first electrode layer is fluorine-doped tin oxide.

10. A method as claimed in claim 1, wherein said photo-resist layer is a Novolak/epoxy/photopolymer.

11. A method as claimed in claim 1, wherein said second electrode layer is comprised of material selected from the group consisting of silver, palladium, and nickel-chrome.

* * * * *